United States Patent [19]

Sawaki et al.

[11] Patent Number: 4,937,613
[45] Date of Patent: Jun. 26, 1990

[54] EXPOSURE UNIT IN IMAGE RECORDING APPARATUS

[75] Inventors: Yukichi Sawaki, Gifu; Kenji Sakakibara, Ichinomiya, both of Japan

[73] Assignee: Brother Kogyo Kabushiki Kaisha, Japan

[21] Appl. No.: 301,874

[22] Filed: Jan. 26, 1989

[30] Foreign Application Priority Data

Jan. 29, 1988 [JP] Japan ................ 63-11872[U]

[51] Int. Cl.$^5$ .............................................. G03B 27/72
[52] U.S. Cl. ...................................... 355/27; 355/71; 355/75
[58] Field of Search ............... 355/27, 28, 67–69, 355/71, 75

[56] References Cited

U.S. PATENT DOCUMENTS

| | | | |
|---|---|---|---|
| 3,517,997 | 6/1970 | Ghiselli, Jr. ........................... | 355/71 |
| 3,712,731 | 1/1973 | Shiina ................................... | 355/71 |
| 4,095,881 | 6/1978 | Maddox ............................... | 355/71 X |
| 4,333,130 | 6/1982 | Mochizuki et al. ................... | 355/71 X |
| 4,799,085 | 1/1989 | Nagumo et al. ..................... | 355/27 |

Primary Examiner—L. T. Hix
Assistant Examiner—D. Rutledge
Attorney, Agent, or Firm—Oliff & Berridge

[57] ABSTRACT

An exposure unit in an image recording apparatus for exposing a photosensitive image recording medium to light is disclosed. The exposure unit includes a light source, and other optical components for directing light to an original and for introducing light reflected at or transmitted through an original to an exposure zone. The light source and the optical components define in combination a light path which has a first light path and a second light path. The first light path extends between the light source and the original and the second light path extends between the original and the exposure zone. An infrared rays non-transmissive filter is disposed at the first light path. Therefore, light directed toward the original is subjected to filtering so that infrared ray components contained in the light is blocked and does not reach the original.

7 Claims, 3 Drawing Sheets

EXPOSURE UNIT IN IMAGE RECORDING APPARATUS

BACKGROUND OF THE INVENTION

The present invention relates to an exposure unit in an image recording apparatus, and more particularly to such unit in which light emitted from a light source is reflected at or transmitted through an original and the light directing from the original is irradiated onto an image recording medium such as photosensitive pressure sensitive recording medium.

An image recording medium is generally classified into a self-contained type recording medium and a transfer type recording medium. In the self-contained type recording medium, an encapsulated chromogenic material or dye precursor and a developer material are co-deposited on one surface of a single substrate as one layer or as two contiguous layers. The self-contained type is disclosed in U.S. Pat. No. 4,440,846.

In the transfer type recording medium, the developer material is coated on a separate substrate as a separate developer or copy sheet. The transfer type is disclosed in U.S. Pat. No. 4,399,209. More specifically, the transfer type image recording medium comprises a microcapsule sheet (first image recording medium) and a developer sheet (second image recording medium). The first image recording medium comprises a photosensitive pressure sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material.

A commonly assigned copending U.S. patent application Ser. No. 244,681 has been filed on Sept. 14, 1988 which discloses an image recording apparatus shown in FIG. 1. This apparatus employs the transfer type image recording medium comprising a photosensitive pressure sensitive recording medium 20 and a developer medium 21. The apparatus has a main frame 30 and an upper wall 30a, and an original stand cover 1 is mounted on the upper wall 30a. Below the cover 1, a transparent original stand glass 2 is provided. Between the original stand cover 1 and the original stand glass 2, an original (not shown) is interposed with its imaging surface facing down. The original stand glass 2 and the cover 1 are movable in a direction indicated by an arrow. A during exposure operation by a drive means (not shown). The upper wall 30a is formed with a slit 30b extending in a direction perpendicular to the moving direction of the original stand glass 2.

Within the main frame and below the original stand glass 2, there is provided an exposure unit including an optical system B. The optical system B is partitioned by a lamp housing 4. The lamp housing 4 is formed with a slit 14. The optical system B has a linear light source 3 for irradiating light to the imaging surface of the original. The light source 3 is adapted to impart linear light to the original surface through the linear slit 30b. Therefore, when the original is moved in the direction A upon movement of the cover 1 and the glass 2, a predetermined area of the original can undergo linear light irradiation for successively irradiating the entire imaging area of the original.

The optical system B also includes a reflection mirror 5 disposed beside the light source 3. The reflection mirror 5 is adapted to reflect partial light from the light source 3 toward the slit 30b, which partial light has not been directly oriented toward the slit 30b from the light source 3. The optical system B directs light reflected at or transmitted through the original toward an exposure zone E by a first reflector 6a and a second reflector 6b through a shutter 9, a lens 10 and a filter means 11. The first reflector 6a is adapted to reflect light from the the original toward the shutter 9. The shutter 9 allows the light to selectively pass therethrough for selectively directing the light toward the lens 10. The filter 11 is disposed immediately downstream of the lens with respect to optical path P. The filter means 11 is adapted to selectively transmit light having specific wavelength therethrough. More specifically, the filter means 11 includes at least three filter members for selectively passing therethrough each one of cyan, magenta and yellow lights. At one end portion of the main frame 30, the second reflector 6b is disposed for reflecting the thus directed light toward the exposure zone E through the slit 14.

Within the main frame 30, and below the lamp housing 4, a photosensitive sheet cartridge 13 is disposed in which the rolled photosensitive pressure sensitive sheet 20 is accomodated. The exposure zone E is defined at an upper surface area of the cartridge 13. A plurality of sheet feed rollers 13a are rotatably disposed around the sheet cartridge 13. These rollers 13a are adapted to transfer the photosensitive pressure sensitive sheet 20 in the cartridge 13 toward a pressure developing unit 15. In this case, the travelling speed of the photosensitive sheet 20 is synchronous with the moving speed of the original support glass 2, and therefore, when the sheet 20 passes through the exposure zone E, a latent image corresponding to the original image is formed on the sheet 20.

The pressure developing unit is positioned downstream of the exposure zone E, and below the unit 15 a developer sheet cassette 17 is disposed, in which cut developer sheets 21 are accomodated. Above the cassette 17 a sheet delivery roller 16 is provided for supplying each one of the developer sheets 21 toward the pressure developing unit 15. A sheet guide 16a is provided between the cassette 17 and the pressure developing unit 15 for guiding travel of the developer sheet 21.

Immediately upstream of the pressure developing unit, the developer sheet 21 is superposed with the photosensitive pressure sensitive recording medium 20 which carries the latent image. These sheets 20 and 21 are subjected to pressure developing operation at the unit 15, where the non-photo-cured microcapsules on the sheet 20 are ruptured by the pressure application, so that chromogenic materials are flowed from the ruptured microcapsules to react with the developer material, to thereby obtain a visible image on the developer sheet. The pressure developing unit 15 has a guide roller 15a so as to direct the sheets 20 and 21 downwardly. Details of the unit 15 are disclosed in a copending U.S. patent application Ser. No. 157,478 filed on Feb. 17, 1988.

A separation roller 15b is provided at a position immediately downstream of the pressure developing unit 15 for separating the photosensitive pressure sensitive sheet 20 from the developer sheet 21. Beside the separation roller 15b, a second guide roller 15c is provided for changing direction of the sheet 20. Further, at another upper side of the main frame 30, a take-up means 19 is provided for winding the photosensitive sheet 20 thereover.

At a downstream side of the guide roller 15b and above the cassette 17, a developer sheet guide roller 17a is disposed. Further, a thermal fixing unit 18 is disposed at a position downstream of the developer sheet guide roller 17a for obtaining glossy image on the developer sheet 21. The thus treated developer sheet is discharged out of the main frame through a discharge port 30c.

In such image recording apparatus, the amount of light irradiation from the light source is intended to be increased in order to increase exposure speed or to enhance exposure accuracy. However, if the amount of light irradiation exceeds a predetermined level, infrared rays are also increased, and the rays may thermally deteriorate the original. Therefore, high speed exposure or highly accurate exposure operation may not be conducted.

Further, since the elongated slit 30b is formed on the upper wall 30a of the main frame 30, foreign objects may enter into an interior space defined by the lamp housing 4. Therefore, components in the optical system may be contaminated with the foreign objects.

SUMMARY OF THE INVENTION

It is therefore, an object of the present invention to provide an improved exposure unit which can overcome the above described drawback.

Another object of this invention is to provide such exposure unit in an image recording apparatus, which exposure unit is capable of preventing an original from being thermally deteriorated due to irradiation with infrared rays.

Still another object of the invention is to provide such an exposure unit which prevents foreign objects from entering into a lamp housing.

These and other objects of the invention can be attained by providing an exposure unit in an image recording apparatus having a main frame for exposing an image recording medium to light in order to form a latent image thereon corresponding to an image of an original at an exposure zone, the exposure unit comprising; a light source for irradiating light to the original, the light being reflected at the original or transmitted therethrough; optical components disposed between the light source and the exposure zone, the light source and said optical components defining a light path reaching the exposure zone, the light path having a first light path extending between the light source and the original, and a second light path extending between the original and the exposure zone; and, an infrared rays non-transmissive filter disposed at the first light path.

With the arrangement, the light emitted from the light source is initially transmitted through the infrared rays non-transmissive filter. Therefore, infrared rays contained in the high intensity light can be blocked by the filter. As a result, thermal deterioration of the original due to the application of infrared rays is avoidable.

DETAILED DESCRIPTION OF THE PREFERRED EMBODIMENTS

Figure 1:
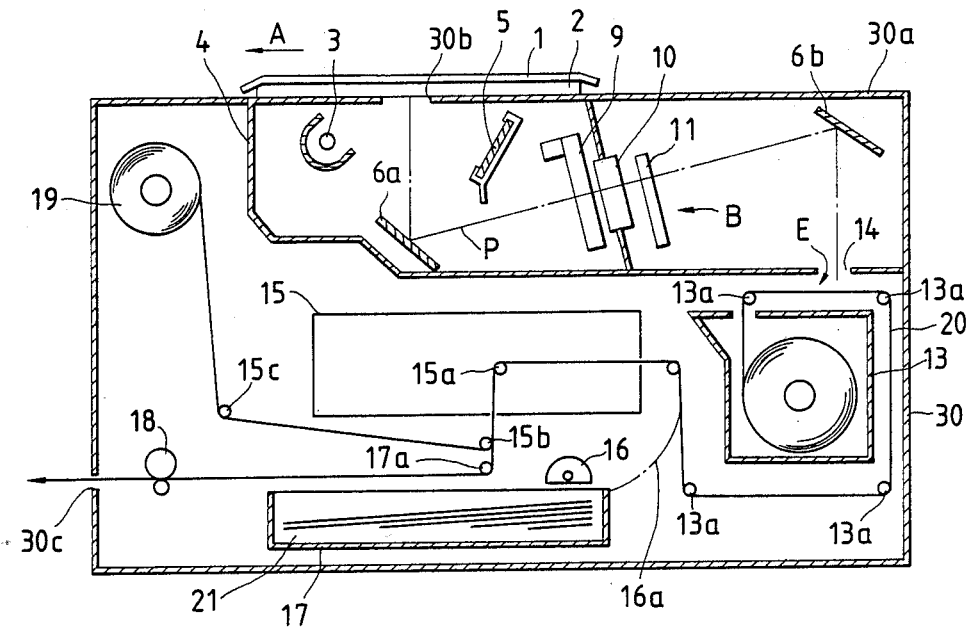
FIG. 1 is a schematic cross-sectional view showing an image recording apparatus disclosed in a copending U.S. patent application Ser. No. 244,681.
Figure 2:
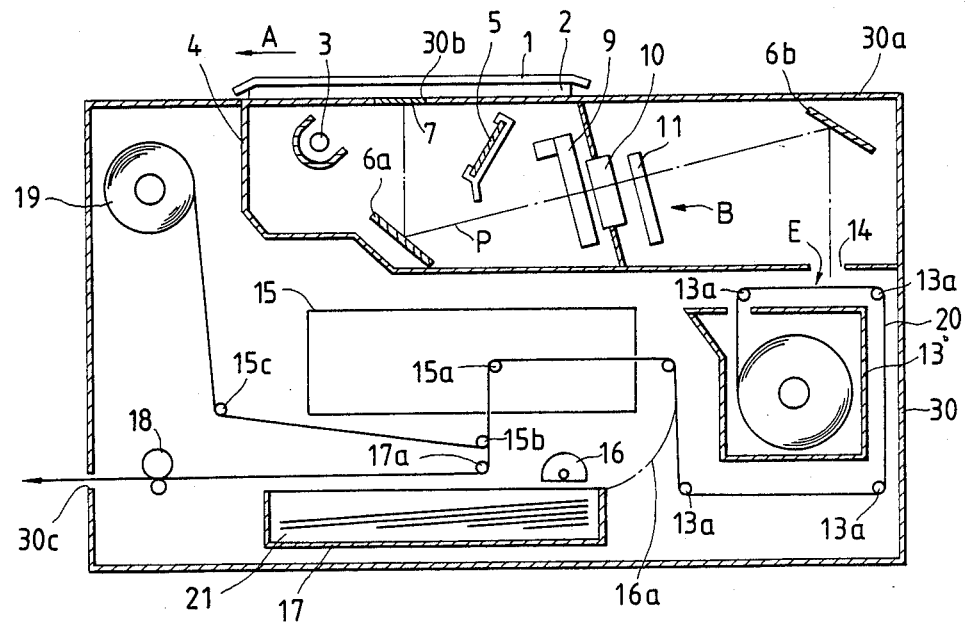
FIG. 2 is a schematic cross-sectional view showing an image recording apparatus which is provided with an exposure unit according to a first embodiment of this invention.
Figure 3:
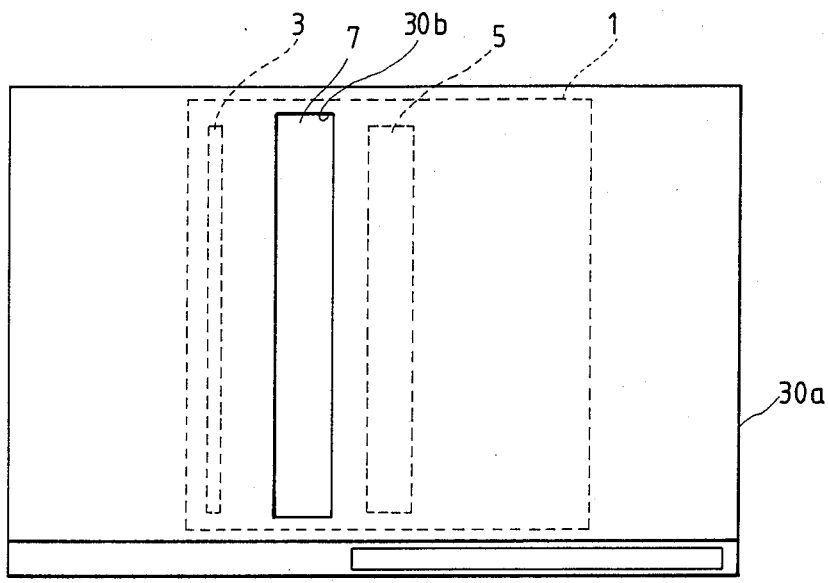
FIG. 3 is a top plan view of the exposure unit according to a first embodiment of this invention.
Figure 4:
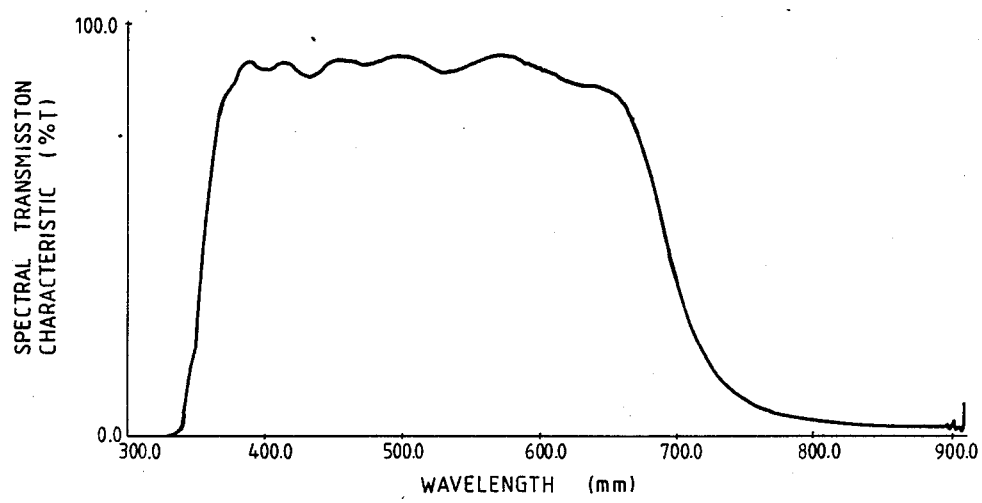
FIG. 4 is a graphical representation showing a spectral transmission characteristic in an infrared rays non-transmittive filter according to the present invention.

A first embodiment according to this invention is shown in FIGS. 2 thru 4, wherein like parts and components are designated by the same reference numerals and characters as those shown in FIG. 1 for eliminating duplicating description.

In the embodiment, an infrared rays non-transmittive filter means such as an infrared rays reflection filter 7 is assembled into an elongated slit 30b formed in an upper wall of a main frame 30.

As best shown in FIGS. 2 and 3, lights emitted from a linear light source 3 or lights emitted therefrom and reflected at a reflection mirror 5 are directed toward the elongated slit 30b and pass through the infrared rays reflection filter 7, so that an original is subjected to linear light exposure. The linear-lights then again pass through the infrared rays reflection filter 7 and reach the exposure zone E through a first reflector 6a, a shutter 9, a lens 10 a second reflector 6b and a slit 14. With this arrangement, optical path P is defined between the light source 3 and the exposure zone E by way of the original by means of the above described optical components. Here, the optical path has a first optical path extending between the light source 3 and the original and a second light path extending between the original and the exposure zone E, and the infrared rays non-transmissive filter 7 is positioned at the first light path. Therefore, even if high intensity light is irradiated onto the original, infrared rays contained therein are blocked by the filter 7, and accordingly, the original is protected from thermal degradation. Further, since the filter 7 closes an open space of the elongated slit 30b, foreign objects cannot enter into a lamp housing 4.

FIG. 4 shows a relationship between a spectral transmission characteristic and wavelengths in the infrared rays reflection filter 7. As is apparent from the graph, the infrared rays having long wavelength do not easily pass through the filter 7.

Figure 6:
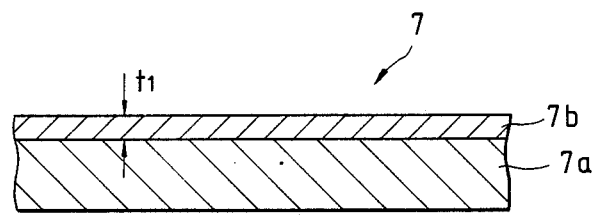

As shown in FIG. 6, the filter 7 is formed of a transparent glass plate 7a on which a deposition layer 7b made of $TiO_2$ or $SiO_2$ is provided by, for example, a vapor deposition. By controlling the thickness $t_1$ of the deposition layer 7b, the wavelength of light transmitted through the filter 7 is selected.

Figure 5:
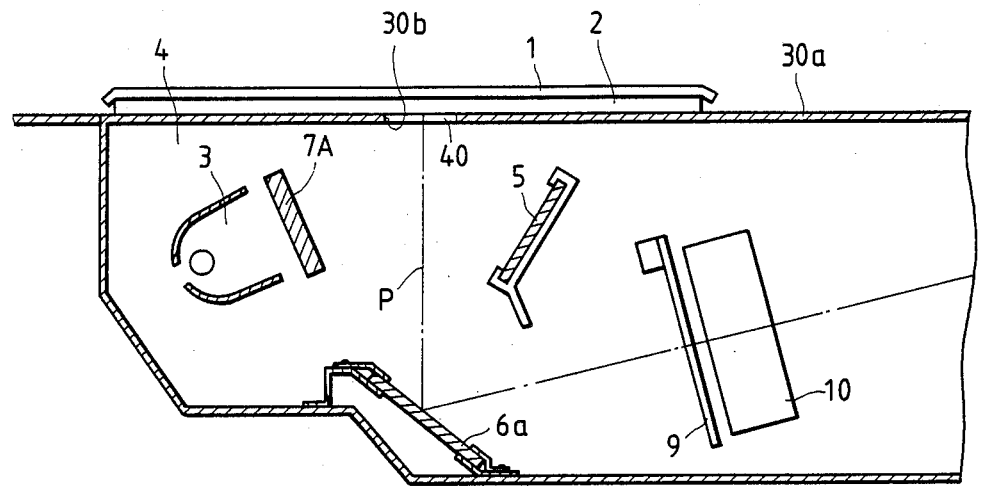
FIG. 5 is a schematic cross-sectional view showing an exposure unit according to a second embodiment of this invention; and, FIG. 6 is a cross-sectional view showing a filter means according to this invention.

A second embodiment according to this invention is shown in FIG. 5 wherein like parts and components are designated by the same reference numerals and characters as those shown in the first embodiment. FIG. 5 particularly shows a lamp housing 4. According to the second embodiment, an infrared rays reflection filter 7A is not assembled into the elongated slit 30b but is positioned in front of a light source 3, which position is at the first optical path described above. Therefore, lights emitted from the light source 3 are all initially passed through the infrared rays reflection filter 7A, and directly reach an original (not shown) or indirectly reach the same through the reflection mirror 5. When the lights pass through the filter 7A, infrared rays components cannot pass therethrough, and therefore, the rays do not reach the original. As a result, thermal deterioration of the original due to the infrared rays can be obviated.

Further, it should be noted that the infrared rays reflection filter 7 or 7A also prevents some extent of a visible light ray from passing therethrough. In this respect, according to the first embodiment, the lights emitted from the light source 3 pass through the filter 7 to reach the original, and then pass through the filter 7 to reach the exposure zone E. Therefore, such twice passing of the light through the filter 7 may excessively cut the visible light, which in turn may degrade exposure operation. On the other hand, according to the second embodiment, the lights from the light source only once pass through the filter 7A to reach the exposure zone E. Therefore, excessive cutting of the visible light is eliminatable in the second embodiment, to thereby enhance copying quality. Further, in the second embodiment, the filter 7A is not positioned to close the elongated slit 30b. In this connection, a transparent glass 40 can be assembled at the elongated slit 30b. The glass 40 can allow light to transmit therethrough, but prevents dusts or any foreign objects from entering the lamp housing 4 housing through the slit 30b.

In the following embodiments, the infrared rays reflection filter 7 or 7A is used as the infrared rays non-transmissive filter means. However, other type of filter such as an infrared rays absorbing filter is also available. Further, in the above described embodiments, the light is reflected at the imaging surface of the original and is then directed to the exposure zone E. However, light transmissive type original can also be available in the present invention.

According to the present invention, because of the employment of the infrared rays non-transmissive filter, the filter blocks the infrared rays, so that the original is not irradiated with the infrared rays. As a result, the thermal deterioration of the original is avoidable in the present invention.

What is claimed is:

1. An exposure unit in an image recording apparatus having a main frame for exposing an image recording medium to light in order to form a latent image thereon corresponding to an image of an original at an exposure zone, which exposure unit comprising:
    a light source for irradiating light to said original, said light being reflected at said original or transmitted therethrough;
    optical components disposed between said light source and said exposure zone, said light source and said optical components defining a light path reaching said exposure zone, said light path having a first light path extending between said light source and said original, and a second light path extending between said original and said exposure zone; and
    an infrared rays non-transmissive filter disposed at said first light path, wherein said main frame has an upper wall formed with a slit for allowing said light from said light source to pass therethrough, to thereby irradiate said original with said light, said filter being positioned at said slit.

2. The exposure unit as defined in claim 1 wherein said image recording medium comprises a first image recording medium and a second image recording medium, said first image recording medium comprising a photosensitive pressure sensitive recording medium provided with microcapsules, said microcapsules encapsulating therein a first material having first and second phases dependent on light exposure, and said second image recording medium comprising a developer medium provided with a second material which provides an output image upon reaction with said first material, said latent image being formed on said photosensitive pressure sensitive recording medium.

3. The exposure unit as defined in claim 1 further comprising a light transmissive glass assembled in said slit.

4. The exposure unit as defined in claim 1, wherein said filter is stationarily mounted in said slit.

5. An image recording apparatus including an exposure unit for exposing an image recording medium to light in order to form a latent image thereon corresponding to an image of an original, comprising;
    a main frame having an upper wall, said upper wall having a slit over which an original is passed during a recording process;
    an exposure unit located inside said main frame, said exposure unit including a light source for irradiating light through said slit to an original, said light being reflected at the original or transmitted therethrough and passed along a light path to an exposure zone, optical components disposed between said light source and said exposure zone, and an infrared rays non-transmissive filter positioned in said slit, said filter permitting visible light to pass therethrough, but preventing the passage of infrared rays therethrough.

6. The apparatus of claim 5, wherein said filter is stationarily supported in said slit.

7. The apparatus of claim 5, further comprising a light transmissive glass assembled in said slit.

* * * * *